US008604569B2

(12) United States Patent
Hosotani et al.

(10) Patent No.: US 8,604,569 B2
(45) Date of Patent: Dec. 10, 2013

(54) MAGNETORESISTIVE ELEMENT

(75) Inventors: Keiji Hosotani, Sagamihara (JP);
Yoshiaki Asao, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 767 days.

(21) Appl. No.: 12/243,250

(22) Filed: Oct. 1, 2008

(65) Prior Publication Data

US 2009/0091863 A1 Apr. 9, 2009

(30) Foreign Application Priority Data

Oct. 3, 2007 (JP) ................................ 2007-260240

(51) Int. Cl.
*H01L 29/82* (2006.01)
(52) U.S. Cl.
USPC ............ 257/421; 257/422; 257/427; 365/158
(58) Field of Classification Search
USPC ........... 257/421, 422, 427, E27.006; 365/158
See application file for complete search history.

(56) References Cited

U.S. PATENT DOCUMENTS

| 6,914,284 | B2 | 7/2005 | Nakajima et al. | |
|---|---|---|---|---|
| 7,405,087 | B2 | 7/2008 | Nakajima et al. | |
| 7,598,555 | B1 * | 10/2009 | Papworth Parkin | 365/158 |
| 2002/0064004 | A1 * | 5/2002 | Worledge | 360/324.2 |
| 2004/0114284 | A1 * | 6/2004 | Rachid et al. | 360/324.11 |
| 2008/0310215 | A1 * | 12/2008 | Ueda | 365/158 |

FOREIGN PATENT DOCUMENTS

| JP | 2002-374020 | 12/2002 |
|---|---|---|
| JP | 2006-60044 | 3/2006 |

OTHER PUBLICATIONS

Park et al., Inverse Magnetoresistance in Magnetic Tunnel Junction With an Fe3O4 Electrode, IEEE Transactions on Magnetics, Vol. 41, No. 10, Oct. 2005, pp. 2691-2693.*
M. Hosomi, et al., "A Novel Nonvolatile Memory with Spin Torque Transfer Magnetization Switching: Spin-RAM", IEEE, Dec. 2005, pp. 1-4.
Koji Tsunekawa, "Giant tunneling magnetoresistance effect in low-resistance CoFeB/MgO(001)/CoFeB magnetic tunnel junctions for read-head applications", Applied Physics Letters, vol. 87, No. 072503, 2005, pp. 1-3.
Hitoshi Kubota, et al. "Evaluation of Spin-Transfer Switching in CoFeB/MgO/CoFeB Magnetic Tunnel Junctions", Japanese Journal of Applied Physics, vol. 44, No. 40, 2005, L 1237-L 1240.
Office Action issued May 15, 2012 in Japanese Patent Application No. 2007-260240 (with English translation).

* cited by examiner

*Primary Examiner* — Vanthu Nguyen
*Assistant Examiner* — Hien Nguyen
(74) *Attorney, Agent, or Firm* — Oblon, Spivak, McClelland, Maier & Neustadt, L.L.P.

(57) ABSTRACT

A magnetoresistive element includes a first electrode layer, a first fixed layer provided on the first electrode layer and having a fixed magnetization direction, a first intermediate layer provided on the first fixed layer and made of a metal oxide, a free layer provided on the first intermediate layer and having a variable magnetization direction, and a second electrode layer provided on the free layer. At least one of the first electrode layer and the second electrode layer contains a conductive metal oxide.

6 Claims, 11 Drawing Sheets

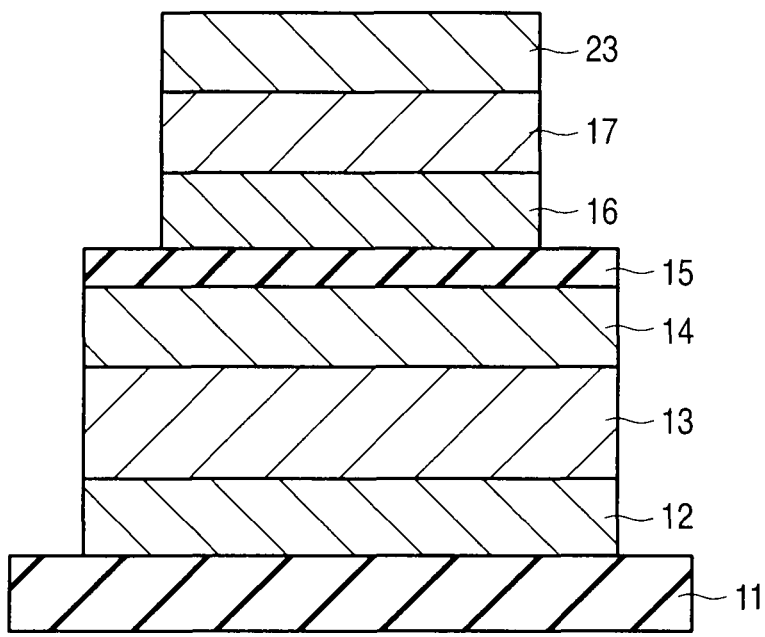
F I G. 7
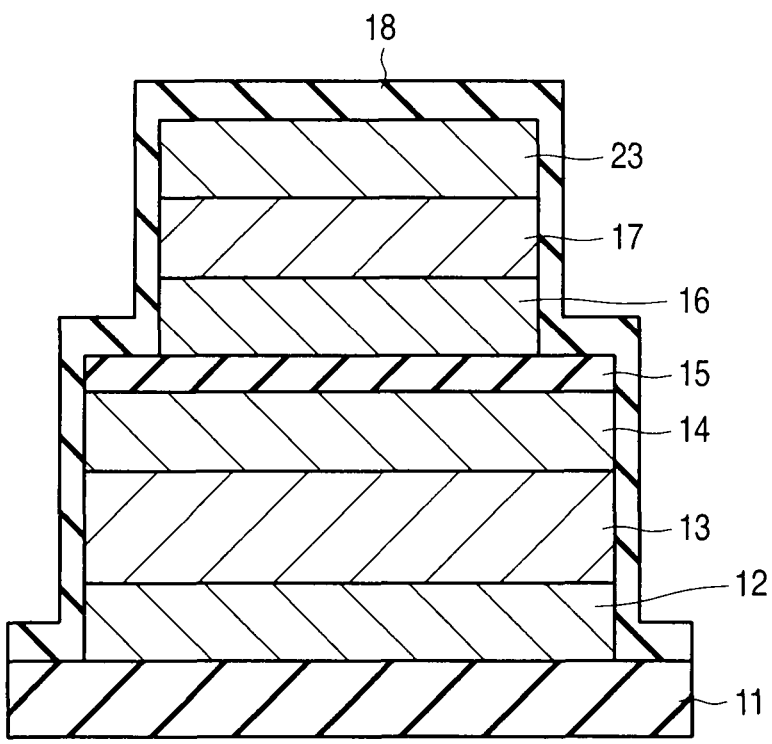
F I G. 8

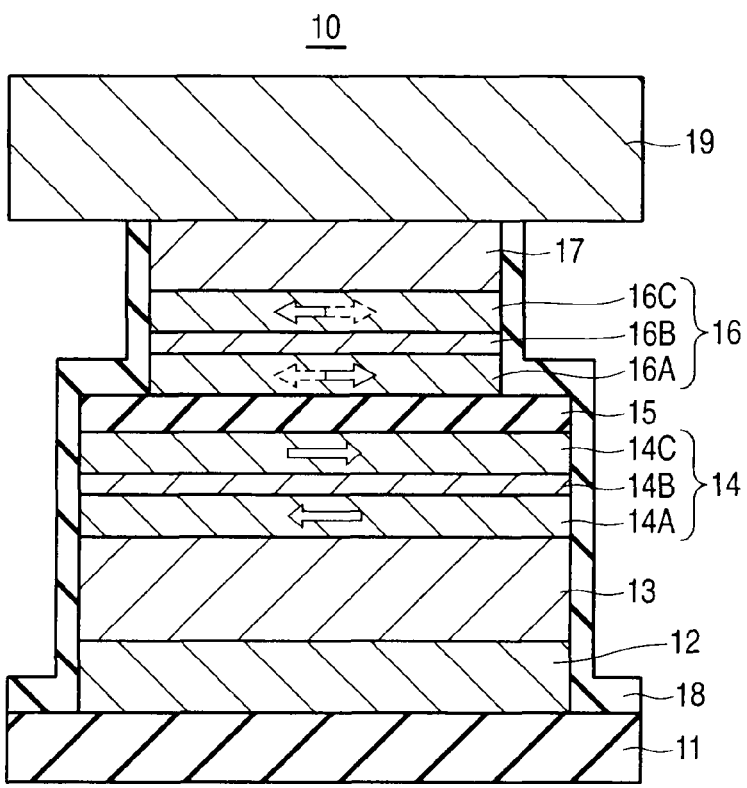
F I G. 10B
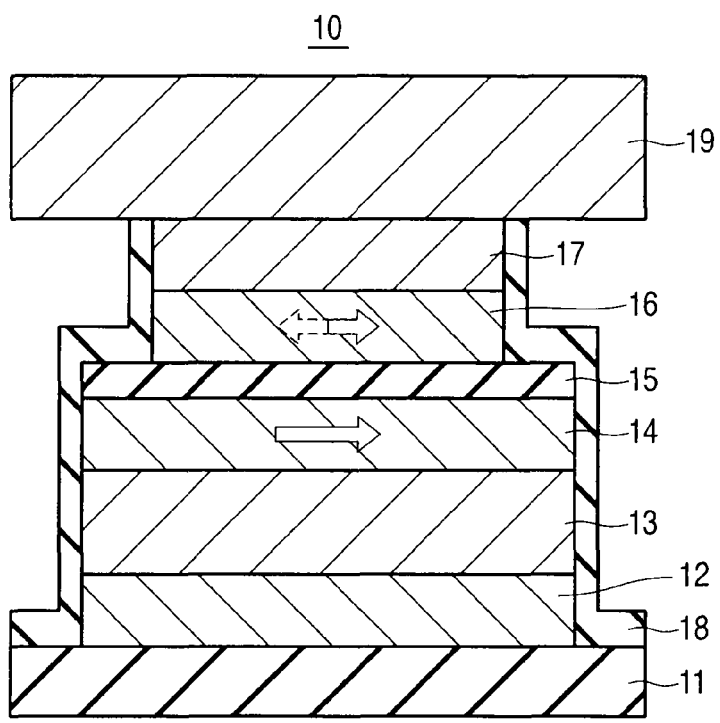
F I G. 11

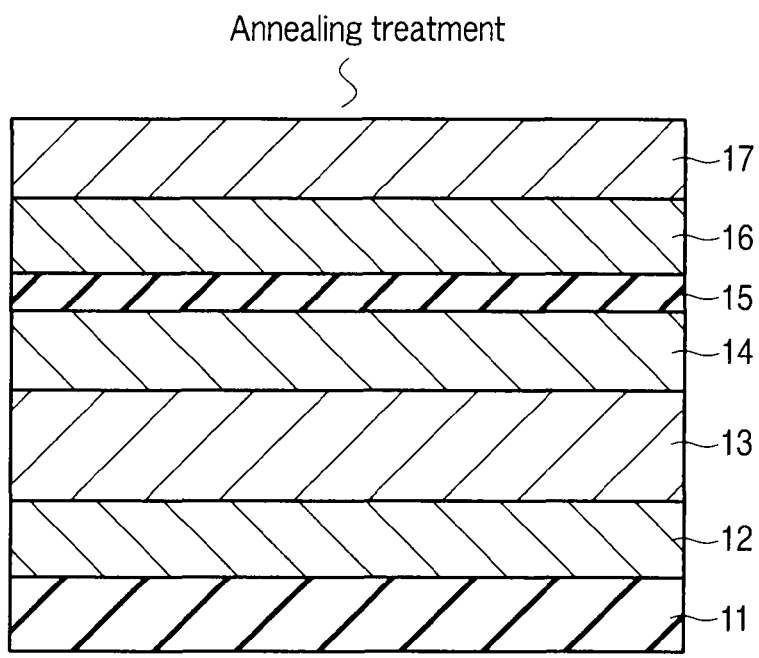
F I G. 12
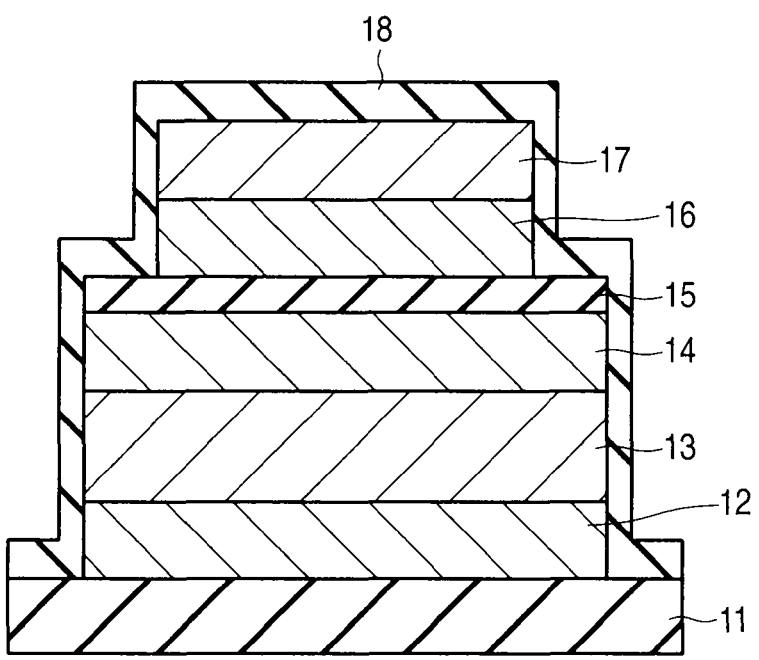
F I G. 13

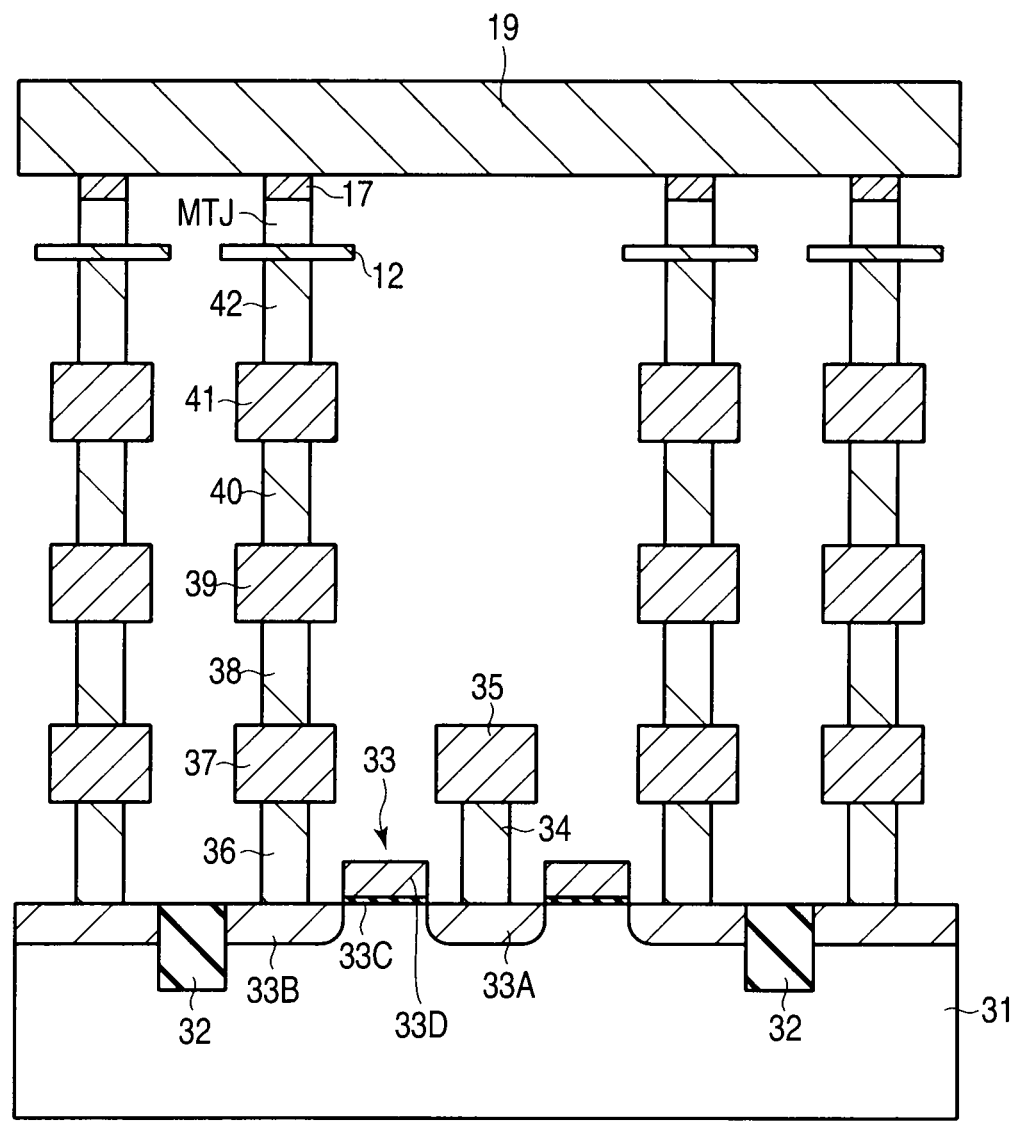
F I G. 18

MAGNETORESISTIVE ELEMENT

CROSS-REFERENCE TO RELATED APPLICATIONS

This application is based upon and claims the benefit of priority from prior Japanese Patent Application No. 2007-260240, filed Oct. 3, 2007, the entire contents of which are incorporated herein by reference.

BACKGROUND OF THE INVENTION

1. Field of the Invention

The present invention relates to a magnetoresistive element. More particularly, it relates to, for example, a magnetoresistive element in which a current can bidirectionally be supplied to record information.

2. Description of the Related Art

In recent years, a large number of memories in which information is stored in accordance with a new principle have been suggested, and as one of them, a magnetic random access memory (MRAM) is known in which the tunneling magnetoresistive (TMR) effect is utilized.

The MRAM stores binary data "1", "0" by a magnetic tunnel junction (MTJ) element. This MTJ element has a structure in which a nonmagnetic layer (a tunnel barrier layer) is sandwiched between two magnetic layers (a free layer and a pinned layer). The information to be stored in the MTJ element is judged on whether the spinning directions of two magnetic layers are parallel or anti-parallel.

In a spin injection MRAM, a current is supplied in a direction perpendicular to the film surface of the MTJ element, and the spin is injected into the free layer in accordance with the direction in which the current is supplied, to cause magnetization reversal. When the MTJ element is of a perpendicular magnetization type, uniaxial anisotropy is imparted in the direction perpendicular to the film surface. Unlike an in-plane magnetization type, magnetic shape anisotropy does not have to be imparted in a planar direction. Therefore, the aspect ratio of the MTJ element can be set substantially to 1 to minimize the MTJ element to a processing limit in principle. Moreover, unlike the in-plane magnetization type, current magnetic field interconnects for biaxially generating current magnetic fields in different directions become unnecessary. So long as two terminals connected to upper and lower electrodes of the MTJ element are present, the MTJ element can operate, so that a cell area per bit can be reduced.

In recent years, it has been demonstrated that (001) face oriented polycrystalline magnesium oxide (MgO) as the tunnel barrier layer of the MTJ element is sandwiched between similarly (001) face oriented polycrystalline CoFeB's to allow MgO to operate as a spin filter, and electrons are supplied from the pinned layer to the free layer to reverse the magnetization of the free layer from the anti-parallel magnetization to the parallel magnetization, or conversely, the electrons are supplied from the free layer to the pinned layer to reverse the magnetization of the free layer from the parallel magnetization to the anti-parallel magnetization, and in addition, this magnesium oxide (MgO) is a promising material which realizes the spin injection MRAM having a high TMR effect (see Documents 1 and 2).

Document 1 (K. Tsunekawa et al., "Giant Magnetoresistive Tunneling Effect in Low-resistance CoFeB/MgO(001)/CoFeB Magnetic Tunnel Junctions for Read Head Applications", Appln. Phys. Lett. 87, 072503 [2005])

Document 2 (H. Kubota et al., "Evaluation of Spin-Transfer Switching in CoFeB/MgO/CoFeB Magnetic Tunnel Junctions", Jpn. J. Appln. Phys. 44, pp. L1237 to L1240 [2005])

In addition, to decrease write current, the volume of the free layer, saturation magnetization Ms, a dumping constant and the like need to be decreased. However, there is a physical limit on film thinning for decreasing the volume of the free layer, and there is a processing limit on area reduction in the planar direction. Moreover, when the dumping constant is excessively lowered, thermal stability deteriorates, and hence parameters need to be adjusted to be entirely balanced, thereby decreasing the write current, and it is not easy to thin the free layer. If the write current cannot be sufficiently decreased, a power source voltage of a circuit is usually constant, and hence the film thickness of an MgO barrier needs to be decreased to lower a resistance, thereby setting a necessary write current. Therefore, the MgO barrier which is a constitutional requirement for the MTJ element needs to be a sufficiently thin film, and a high voltage stress continues to be applied during use.

The MgO barrier and CoFeB formed on and under the MgO barrier are polycrystalline, but they are laminated on the (001) face together as microscopically viewed. As to the MgO barrier, in a mainstream process at present, an MTJ laminated film is formed by a sputtering process, and then the film is annealed at a desired temperature (e.g., 360° C.) to crystallize the same. Such a method may bring about an interface defect due to lattice mismatch present between MgO and CoFeB, and various defects such as Mg defect, oxygen defect, and polycrystalline grain boundaries present in the MgO barrier owing to the use of the sputtering process. In a case where the MTJ element using the MgO barrier is used in an MRAM cell, it is feared that the existing defective portions become triggers of deterioration and hence the MgO barrier deteriorates earlier than its intrinsic life. Above all, in a metal oxide based insulator, the oxygen defect is easily generated. A countermeasure for decreasing the defect is important, but the countermeasure is not sufficient in the present mainstream process.

It is to be noted that the MTJ element in which magnesium oxide (MgO) is used as the tunnel barrier layer has been described above, but also in a case where aluminum oxide is used, the problem of the oxygen defect is basically present, and the countermeasure is necessary.

BRIEF SUMMARY OF THE INVENTION

According to an aspect of the present invention, there is provided a magnetoresistive element comprising: a first electrode layer; a first fixed layer provided on the first electrode layer and having a fixed magnetization direction; a first intermediate layer provided on the first fixed layer and made of a metal oxide; a free layer provided on the first intermediate layer and having a variable magnetization direction; and a second electrode layer provided on the free layer. At least one of the first electrode layer and the second electrode layer contains a conductive metal oxide.

According to an aspect of the present invention, there is provided a magnetoresistive element comprising: a first fixed layer having a fixed magnetization direction; a free layer having a variable magnetization direction; and a first intermediate layer provided between the first fixed layer and the free layer and made of a metal oxide. At least one of the first fixed layer and the free layer is formed by laminating a first magnetic layer, a nonmagnetic layer and a second magnetic layer in this order. The nonmagnetic layer contains a conductive metal oxide.

According to an aspect of the present invention, there is provided a magnetoresistive element comprising: a laminated structure including a first fixed layer having a fixed magnetization direction, a free layer having a variable magnetization direction and a first intermediate layer provided between the first fixed layer and the free layer and made of a metal oxide; and a protective film provided on the circumferential surface of the laminated structure and containing an insulating metal oxide.

According to an aspect of the present invention, there is provided a magnetoresistive element comprising: a laminated structure including a first fixed layer having a fixed magnetization direction, a free layer having a variable magnetization direction and a first intermediate layer provided between the first fixed layer and the free layer and made of a metal oxide; a protective film provided on a circumferential surface of the laminated structure and made of an insulator; and a circumferential wall provided on a circumferential surface of the protective film and made of a metal oxide.

BRIEF DESCRIPTION OF THE SEVERAL VIEWS OF THE DRAWING

FIG. 7 is a sectional view showing a manufacturing step of the MTJ element 10 subsequently to FIG. 6;

FIG. 8 is a sectional view showing a manufacturing step of the MTJ element 10 subsequently to FIG. 7;

FIG. 10B is a sectional view showing still another constitution example of the MTJ element 10 according to the second embodiment;

FIG. 11 is a sectional view showing a constitution of an MTJ element 10 according to a third embodiment of the present invention;

FIG. 12 is a sectional view showing a manufacturing step of the MTJ element 10 according to the third embodiment;

FIG. 13 is a sectional view showing a manufacturing step of the MTJ element 10 subsequently to FIG. 12;

FIG. 18 is a sectional view showing a constitution of an MRAM according to a fifth embodiment of the present invention.

DETAILED DESCRIPTION OF THE INVENTION

Figure 1:
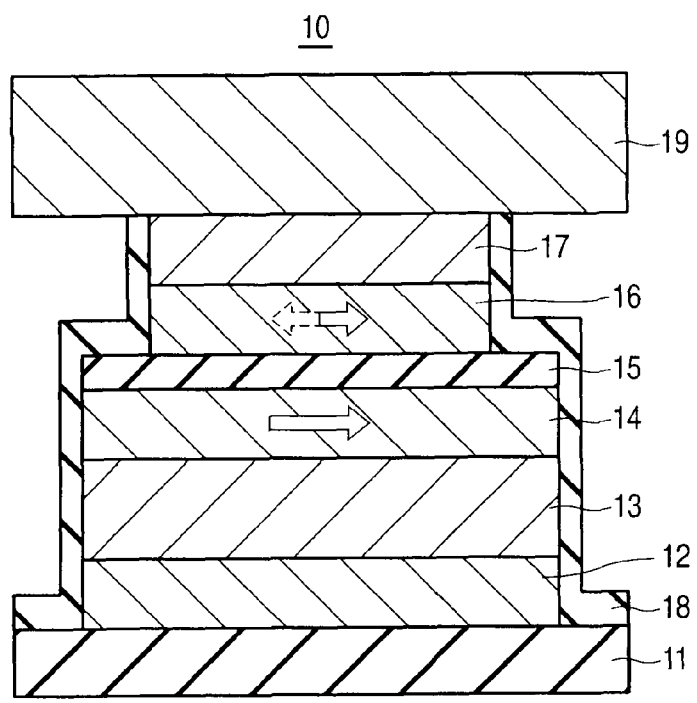
FIG. 1 is a sectional view showing a structure of an MTJ element 10 according to a first embodiment of the present invention.

Embodiments of the present invention will hereinafter be described with reference to the drawings. It is to be noted that in the following description, elements having the same function and constitution are denoted with the same reference numerals, and duplicate description will be given only if necessary.

First Embodiment

In a first embodiment, a metal oxide such as magnesium oxide (MgO) is used in a tunnel barrier layer sandwiched between two magnetic layers, and a conductive metal oxide is used in an upper electrode layer and a lower electrode layer which sandwich an MTJ film therebetween. In consequence, oxygen defect generated in the tunnel barrier layer can be compensated for using oxygen included in the upper electrode layer and the lower electrode layer, and hence a highly reliable tunnel barrier layer can be formed.

[1] Structure of MTJ Element (Magnetoresistive Element) 10

FIG. 1 is a sectional view showing a structure of an MTJ element 10 according to the first embodiment of the present invention.

The MTJ element 10 has a laminated structure in which a lower electrode layer 12, an antiferromagnetic layer 13, a fixed layer (or referred to also as a pinned layer) 14, an intermediate layer (a tunnel barrier layer) 15 made of a nonmagnetic material, a free layer (or referred to also as a recording layer) 16 and an upper electrode layer 17 are laminated in order on an underlayer 11. That is, the MTJ element 10 shown in FIG. 1 is a constitution example of an MTJ element of a so-called single-junction type (a structure in which the free layer and the fixed layer are laminated via a nonmagnetic layer).

A bit line 19 for use in supplying a current to the MTJ element 10 is provided on the upper electrode layer 17. A protective film 18 made of an insulator is provided on the circumferential surface of an MTJ film so that the MTJ film is surrounded. As the protective film 18, for example, silicon nitride is used.

In the fixed layer 14, a magnetization (or spin) direction is fixed (invariable). In the free layer 16, the magnetization direction is variable (reversible). The easy magnetization directions of the fixed layer 14 and the free layer 16 may be perpendicular to a film surface (perpendicular magnetization type) or parallel to the film surface (in-plane magnetization type). It is to be noted that when the MTJ element is of the perpendicular magnetization type, uniaxial anisotropy may be imparted in a direction perpendicular to the film surface, and unlike the in-plane magnetization type, magnetic shape anisotropy does not have to be imparted in a planar direction. Therefore, the aspect ratio of the MTJ element can be set to 1 to minimize the MTJ element to a processing limit in principle, and hence the perpendicular magnetization type is more preferable from viewpoints of miniaturization and decrease of write current.

The antiferromagnetic layer 13 is provided so that the magnetization direction of the fixed layer 14 is fixed. Thus, owing to the exchange coupling of the fixed layer 14 and the antiferromagnetic layer 13, the magnetization of the fixed layer 14 is secured in one direction. Simultaneously, owing to the exchange coupling of the fixed layer 14 and the antiferromagnetic layer 13, high magnetically anisotropic energy is imparted to the fixed layer 14 to impart the function of the fixed layer 14.

It is to be noted that the antiferromagnetic layer 13 of the MTJ element 10 shown in FIG. 1 may be omitted, and a coercive force difference structure may be used. That is, the coercive force of the fixed layer 14 is set to a coercive force sufficiently larger than that of the free layer 16, whereby the MTJ element 10 can have a constitution in which the magnetization direction of the fixed layer 14 is fixed and the free layer 16 has a variable magnetization direction.

The underlayer 11 is used in controlling the crystal orientation properties of the magnetic layer or the antiferromagnetic layer or protecting the magnetic layer or the antiferromagnetic layer.

Figure 2:
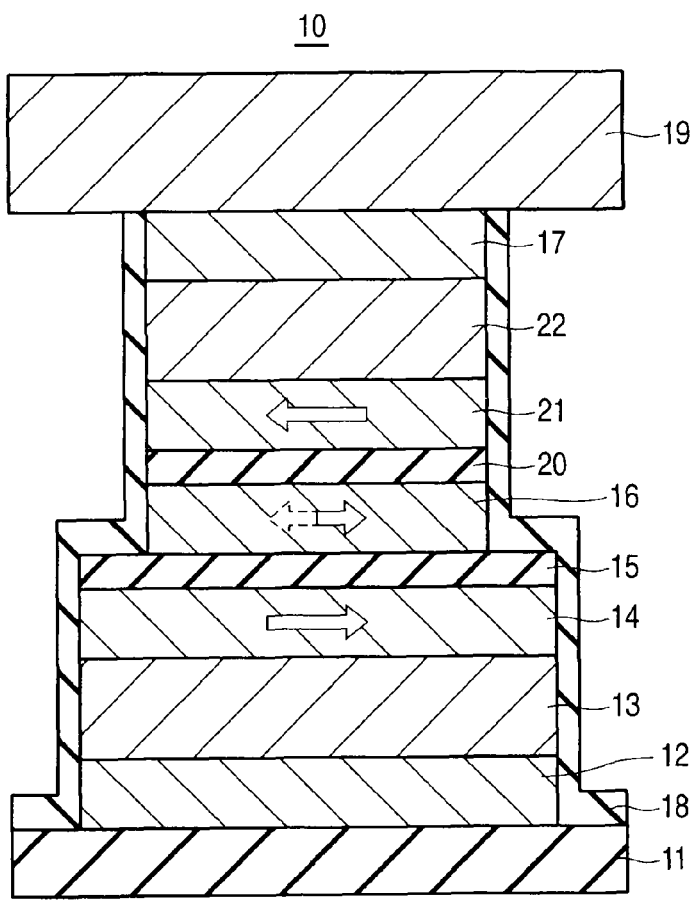
FIG. 2 is a sectional view showing a constitution of the MTJ element 10 of a double-junction type.

The MTJ element 10 of the present embodiment is not limited to the single-junction type, and can be applied to an MTJ element of a so-called double-junction type (i.e., a structure in which two fixed layers are arranged on both sides of the free layer via nonmagnetic layers, respectively). FIG. 2 is a sectional view showing a constitution of the MTJ element 10 of the double-junction type according to the present embodiment.

The double-junction MTJ element 10 has a laminated structure in which the lower electrode layer 12, the antiferromagnetic layer 13, the fixed layer 14, the tunnel barrier layer 15, the free layer 16, a nonmagnetic layer (an intermediate layer) 20, a fixed layer 21, an antiferromagnetic layer 22 and the upper electrode layer 17 are laminated in order on the underlayer 11. In this laminated structure, the laminating order may be reversed.

In the fixed layers 14 and 21, the magnetization (or spin) direction is fixed. Moreover, the magnetization directions of the fixed layers 14 and 21 are set to an anti-parallel direction (an opposite direction). The antiferromagnetic layer 22 is provided so that the magnetization direction of the fixed layer 21 is fixed. It is to be noted that even in the double-junction MTJ element 10, the antiferromagnetic layers 13 and 22 may be omitted, and the coercive force difference structure may be used.

Figure 3:
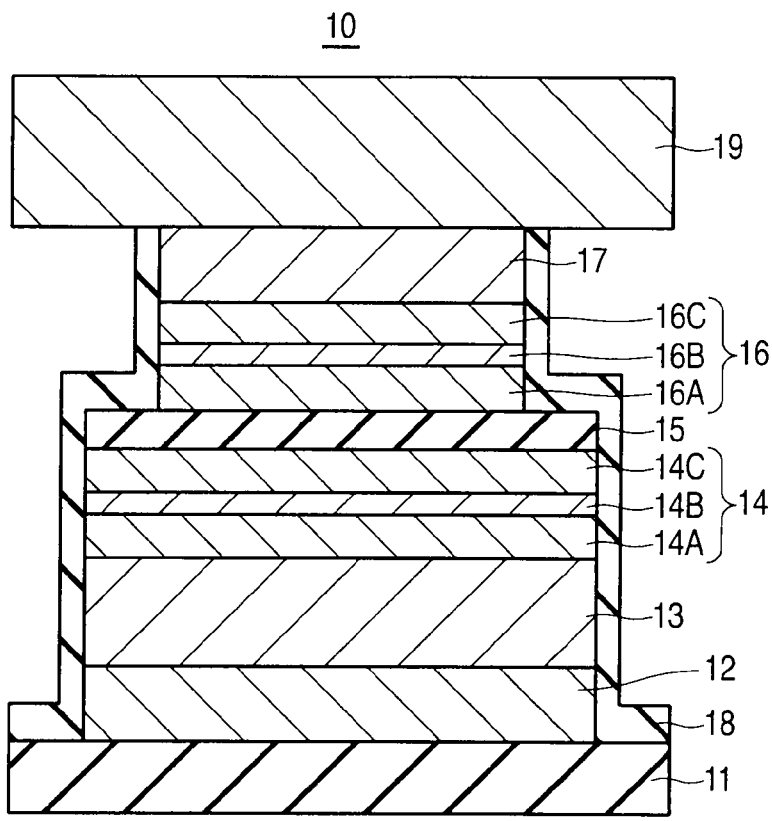
FIG. 3 is a sectional view showing a constitution of the MTJ element 10 having a laminated structure of a free layer 16 and a fixed layer 14.

Furthermore, each of the fixed layer and the free layer may have a laminated structure including two magnetic layers via the nonmagnetic layer therebetween as in the magnetic layer/the nonmagnetic layer/the magnetic layer, a laminated structure including three magnetic layers as in the magnetic layer/the nonmagnetic layer/the magnetic layer/the nonmagnetic layer/the magnetic layer, or an extended laminated structure including more magnetic layers. FIG. 3 is a sectional view showing a constitution of the MTJ element 10 having a structure in which the free layer 16 and the fixed layer 14 are laminated.

The fixed layer 14 is formed into a three-layer structure including, for example, a magnetic layer 14A/a nonmagnetic layer 14B/a magnetic layer 14C. When the fixed layer has the three-layer structure in this manner, antiferromagnetic coupling may be generated between the magnetic layer 14A and the magnetic layer 14C via the nonmagnetic layer 14B. Furthermore, in a case where the antiferromagnetic layer 13 is provided so that the layer comes in contact with the three-layer structure, the magnetization direction of the fixed layer 14 can more firmly be fixed. In consequence, the fixed layer 14 is not easily influenced by an external magnetic field, and the accidental reversing of the magnetization direction can be prevented.

The free layer 16 is formed into a three-layer structure including, for example, a magnetic layer 16A/a nonmagnetic layer 16B/a magnetic layer 16C. Even when the free layer has the three-layer structure in this manner, the antiferromagnetic coupling may similarly be generated between the magnetic layer 16A and the magnetic layer 16C via the nonmagnetic layer 16B. In this case, a magnetic flux closes in a three-layer film, and hence, for example, the increase of a switching magnetic field due to a magnetic pole can be suppressed. As a result, even when the MTJ element 10 has a sub-micron size, for example, the increase of consumption power caused by a current magnetic field due to a diamagnetic field can be suppressed. As the nonmagnetic layers 14B, 16B, copper (Cu), aluminum (Al), silver (Ag), gold (Au) or the like is used.

Moreover, the free layer 16 may have a laminated structure of a soft magnetic layer and a magnetic layer. The soft magnetic layer mentioned herein is a layer in which the magnetization direction more easily reverses as compared with, for example, the magnetic layer. When the free layer has the laminated structure of the soft magnetic layer and the magnetic layer, the soft magnetic layer is arranged close to a current interconnect, for example, a bit line. Furthermore, this laminated structure may further include the nonmagnetic layer. That is, the free layer 16 is formed into the three-layer structure including the soft magnetic layer/the nonmagnetic layer/the magnetic layer.

It is to be noted that, needless to say, the embodiment in which the free layer and the fixed layer have the laminated structure can be applied to the double-junction MTJ element 10. That is, in the double-junction MTJ element 10, the fixed layer 21 may have a three-layer structure including a first magnetic layer/a nonmagnetic layer/a second magnetic layer in addition to the free layer 16 and the fixed layer 14.

There is not any special restriction on the planar shape of the MTJ element 10, and the shape may be circular, elliptic, square, rectangular or the like.

[2] Material Constituting MTJ Element 10

[2-1] Material of Lower Electrode Layer 12 and Upper Electrode Layer 17

As the lower electrode layer 12 and the upper electrode layer 17, a conductive metal oxide is used. Examples of this conductive metal oxide include the following oxides:

(1) an NaCl-type metal oxide such as TiO, VO, NbO or LaO;

(2) a spinel-type metal oxide such as $LiTi_2O_4$ or $Fe_3O_4$;

(3) a perovskite-$ReO_3$-type metal oxide such as $ReO_3$, $LaTiO_3$, $CaTiO_3$, $CaVO_3$, $SrVO_3$, $CaCrO_3$, $SrRuO_3$, $BaRuO_3$ or $SrIrO_3$;

(4) a corundum-type metal oxide such as $V_2O_3$, $Ti_2O_3$ or $Rh_2O_3$; and (5) a rutile-$MoO_2$-type metal oxide such as $VO_2$, $CrO_2$, $NbO_2$, $MoO_2$, $WO_2$, $ReO_2$, $RuO_2$, $RhO_2$, $OsO_2$, $IrO_2$, $PtO_2$, $V_3O_5$ or $Ti_3O_5$.

Among these materials, it is necessary for the metal oxide to be capable of breaking atomic bond between the metal and oxygen with comparatively low energy and supplying an oxygen atom or ion to the tunnel barrier layer and the rutile-$MoO_2$ type is more preferable at this point.

[2-2] Material of Tunnel Barrier Layer 15

As the tunnel barrier layer 15, a metal oxide is used, and it is preferable to use, for example, magnesium oxide (MgO) having a coherent tunneling effect, or a tunnel barrier layer formed by laminating magnesium (Mg) and magnesium oxide (MgO) and performing annealing or the like. Therefore, the MTJ element 10 obtains an MR ratio by use of a tunneling magnetoresistive (TMR) effect. Moreover, in addition to these materials, a metal oxide such as aluminum oxide ($AlO_x$), silicon oxide ($SiO_x$), bismuth oxide ($Bi_2O_3$), strontium titanate ($SrTiO_2$) or lanthanum aluminate ($LaAlO_3$) may be used.

[2-3] Material of Nonmagnetic Layer 20

As the nonmagnetic layer 20, any one of a metal, an insulator and a semiconductor may be used. However, when the insulator or the semiconductor is used, the resistance of the MTJ element 10 increases, so that the metal is preferably used. When the metal is used in the nonmagnetic layer 20, the nonmagnetic layer 20 is referred to as a spacer layer. Examples of the metal conductor for use in the nonmagnetic layer 20 include copper (Cu), aluminum (Al), silver (Ag) and gold (Au). Moreover, as the nonmagnetic layer 20, the same material as that of the tunnel barrier layer 15 may be used.

[2-4] Material of Free Layer 16 and Fixed Layers 14, 21

As the free layer 16 and the fixed layers 14, 21, a magnetic material is used. As to each of the in-plane magnetization MTJ element and the perpendicular magnetization MTJ element, the magnetic material for use in the free layer 16 and the fixed layers 14, 21 will hereinafter be described.

[2-4-1] Material of Free Layer and Fixed Layer for Use in in-Plane Magnetization MTJ Element As the free layer 16 and the fixed layers 14, 21 for use in the in-plane magnetization MTJ element, examples of the magnetic material include the following materials (1 to 4):

(1) iron (Fe), cobalt (Co), nickel (Ni) or an alloy of them;

(2) magnetite having a large spin polarization ratio;

(3) an oxide such as $CrO_2$ or $RXMnO_{3-y}$ (R: rare earth, X: Ca, Ba or Sr); and (4) Heusler alloy such as NiMnSb or PtMnSb.

Moreover, as long as ferromagnetism is not lost, the magnetic material may include, to a certain extent, a nonmagnetic element such as silver (Ag), copper (Cu), gold (Au), aluminum (Al), magnesium (Mg), silicon (Si), bismuth (Bi), tantalum (Ta), boron (B), carbon (C), oxygen (O), nitrogen (N), palladium (Pd), platinum (Pt), zirconium (Zr), iridium (Ir), tungsten (W), molybdenum (Mo) or niobium (Nb).

In the material of the antiferromagnetic layer constituting a part of the fixed layer 14 or 21, Fe—Mn alloy, Pt—Mn alloy, Pt—Cr—Mn alloy, Ni—Mn alloy, Ir—Mn alloy, NiO or $Fe_2O_3$ is preferably used.

[2-4-2] Material of Free Layer and Fixed Layer for Use in Perpendicular Magnetization MTJ Element As the free layer 16 and the fixed layers 14, 21 for use in the perpendicular magnetization MTJ element, a magnetic material having a large coercive force is used. Specifically, a magnetic material having a high magnetically anisotropic energy density of $1 \times 10^6$ erg/cc or more is used.

Examples of the material will hereinafter be described.

(1) An alloy containing at least one element selected from the group consisting of iron (Fe), cobalt (Co) and nickel (Ni) and at least one element selected from the group consisting of chromium (Cr), platinum (Pt) and palladium (Pd). Examples of an ordered alloy include $Fe_{50}Pt_{50}$, $Fe_{50}Pd_{50}$ and $Co_{50}Pt_{50}$. Examples of a random alloy include Co—Cr, Co—Pt, Co—Cr—Pt, Co—Cr—Pt—Ta and Co—Cr—Nb.

(2) A structure in which at least one element selected from the group consisting of iron (Fe), cobalt (Co) and nickel (Ni) or an alloy containing one of these elements and one element of palladium (Pd) and platinum (Pt) or an alloy containing one of these elements are alternately laminated. Examples of the structure include a Co/Pt artificial lattice, a Co/Pd artificial lattice and a CoCr/Pt artificial lattice. When the Co/Pt artificial lattice is used and when the Co/Pd artificial lattice is used, a large value of about 40% can be realized as a resistance change ratio (the MR ratio).

(3) An amorphous alloy containing at least one rare metal element such as terbium (Tb), dysprosium (Dy) or gadolinium (Gd) and at least one transition metal element. Examples of the alloy include Tb—Fe alloy, Tb—Co alloy, Tb—Fe—Co alloy, Dy—Tb—Fe—Co alloy and Gd—Tb—Co alloy.

The free layer 16 may be made of the above magnetic material having a high coercive force. Alternatively, the adjustment of a composition ratio, the addition of impurities, the adjustment of a thickness or the like is performed to constitute the free layer of a magnetic material having a magnetically anisotropic energy density smaller than that of the magnetic material having the high coercive force. Examples of the material will hereinafter be described.

(1) A material in which impurities are added to an alloy containing at least one element selected from the group consisting of iron (Fe), cobalt (Co) and nickel (Ni) and at least one element selected from the group consisting of chromium (Cr), platinum (Pt) and palladium (Pd). Examples of an ordered alloy include an alloy in which impurities such as copper (Cu), chromium (Cr) or silver (Ag) are added to $Fe_{50}Pt_{50}$, $Fe_{50}Pd_{50}$ or $Co_{50}Pt_{50}$ to lower the magnetically anisotropic energy density. Examples of a random alloy include an alloy in which the ratio of a nonmagnetic element in Co—Cr, Co—Pt, Co—Cr—Pt, Co—Cr—Pt—Ta or Co—Cr—Nb is changed to lower the magnetically anisotropic energy density.

(2) A material having a structure in which at least one element selected from the group consisting of iron (Fe), cobalt (Co) and nickel (Ni) or an alloy containing one of these elements and one element of palladium (Pd) and platinum (Pt) or an alloy containing one of these elements are alternately laminated and in which the thickness of a layer including the former element or alloy or the thickness of a layer including the latter element or alloy is adjusted. The thickness of at least one element of Fe, Co and Ni or the alloy containing one of these elements has an optimum value, and the thickness of one element of palladium (Pd) and platinum (Pt) or the alloy containing one of these elements has an optimum value. As the thicknesses come away from these optimum values, the magnetically anisotropic energy density gradually lowers.

When, for example, a Co/Pt artificial lattice is used as the free layer 16, the thickness of Co and Pt can be adjusted to adjust the coercive force of the MTJ element.

(3) A material in which the composition ratio of an amorphous alloy containing at least one rare metal element such as terbium (Tb), dysprosium (Dy) or gadolinium (Gd) and at least one transition metal element is adjusted. For example, the composition ratio of an amorphous alloy such as Tb—Fe, Tb—Co, Tb—Fe—Co, Dy—Tb—Fe—Co or Gd—Tb—Co may be adjusted to decrease the magnetically anisotropic energy density.

When an ordered alloy such as Fe—Pt or Co—Pt is used as the fixed layer, to generate perpendicularly magnetic anisotropy, an fct (001) plane need to be oriented. Therefore, a remarkably thin underlayer made of MgO having a thickness of about several nm is preferably used as a crystal orientation control layer. Except for MgO, an element having an fcc structure or a bcc structure having a lattice constant of about 2.8 Å, 4.0 Å or 5.6 Å, a compound, a metal such as platinum (Pt), palladium (Pd), silver (Ag), gold (Au), aluminum (Al), copper (Cu), chromium (Cr) or iron (Fe), an alloy of them or the like may be used.

In the case of a bottom pin (top free) structure, the crystal orientation control layer may be arranged between a yoke material and the fixed layer. For example, a buffer layer made of Ta, TiN, TaN or the like may be arranged between the crystal orientation control layer and the yoke material. In the case of the top pin (bottom free) structure, MgO in which an fcc (100) plane is oriented is preferably used in the tunnel barrier layer. In this case, the above crystal orientation control layer may further be laminated to such an extent that MR does not deteriorate.

When an ordered alloy such as FePt or CoPt is used as the free layer, the fct (001) plane needs to be similarly oriented. In the case of the top pin structure, the crystal orientation control layer may be arranged between the yoke material and the fixed layer. Between the crystal orientation control layer and the yoke material, for example, a buffer layer made of Ta, TiN, TaN or the like may be arranged. In the case of a bottom pin structure, MgO in which the fcc (100) plane is oriented is preferably used in the barrier layer. In this case, the above crystal orientation control layer may further be laminated to such an extent that MR does not deteriorate.

Moreover, to enhance the perpendicular magnetization properties of the fixed layer and the free layer, a soft magnetic layer formed of a CoFeB or Fe single layer or the like may be inserted between these layers and the tunnel barrier layer.

[3] Operation

The MTJ element 10 is a spin injection magnetoresistive element. Therefore, when data is written to or read from the MTJ element 10, a current is bidirectionally supplied in a direction perpendicular to a film surface (or a laminate surface). First, a data write operation in the single-junction MTJ element 10 shown in FIG. 1 will be described.

When electrons (i.e., the electrons directed from the fixed layer 14 to the free layer 16) are supplied from the side of the fixed layer 14, the electrons spin-polarized in the same direction as the magnetization direction of the fixed layer 14 are injected into the free layer 16. In this case, the magnetization direction of the free layer 16 is aligned in the same direction as the magnetization direction of the fixed layer 14. In consequence, the magnetization directions of the fixed layer 14 and the free layer 16 have parallel arrangement. In this parallel arrangement, the resistance of the MTJ element 10 becomes smallest, and this case is defined as, for example, data "0".

On the other hand, when electrons (i.e., the electrons directed from the free layer 16 to the fixed layer 14) are supplied from the side of the free layer 16, the electrons reflected by the fixed layer 14 and thus spin-polarized in a direction opposite to the magnetization direction of the fixed layer 14 are injected into the free layer 16. In this case, the magnetization direction of the free layer 16 is aligned in the direction opposite to the magnetization direction of the fixed layer 14. In consequence, the magnetization directions of the fixed layer 14 and the free layer 16 have anti-parallel arrangement. In this anti-parallel arrangement, the resistance of the MTJ element 10 becomes largest, and this case is defined as, for example, data "1".

Next, a data write operation in the double-junction MTJ element 10 shown in FIG. 2 will be described.

When the electrons (i.e., the electrons directed from the fixed layer 14 to the free layer 16) are supplied from the fixed layer 14 side, the electrons spin-polarized in the same direction as the magnetization direction of the fixed layer 14, and electrons reflected by the fixed layer 21 and thus spin-polarized in the direction opposite to the magnetization direction of the fixed layer 21 are injected into the free layer 16. In this case, the magnetization direction of the free layer 16 is aligned in the same direction as the magnetization direction of the fixed layer 14. In consequence, the magnetization directions of the fixed layer 14 and the free layer 16 have the parallel arrangement.

On the other hand, when electrons (i.e., the electrons directed from the fixed layer 21 to the free layer 16) are supplied from the side of the fixed layer 21, the electrons spin-polarized in the same direction as the magnetization direction of the fixed layer 21, and the electrons reflected by the fixed layer 14 and thus spin-polarized in the direction opposite to the magnetization direction of the fixed layer 14 are injected into the free layer 16. In this case, the magnetization direction of the free layer 16 is aligned in the direction opposite to the magnetization direction of the fixed layer 14.

Next, the data is read as follows. A read current is supplied to the MTJ element 10. This read current is set to a value (a value smaller than the write current) at which the magnetization direction of the free layer 16 does not reverse. The change in resistance of the MTJ element 10 at this time can be detected using a sense amplifier or the like to read the data stored in the MTJ element 10.

[4] Manufacturing Method

Next, one example of a manufacturing method of the magnetoresistive element according to the present embodiment will be described with reference to the drawings.

Figure 4:
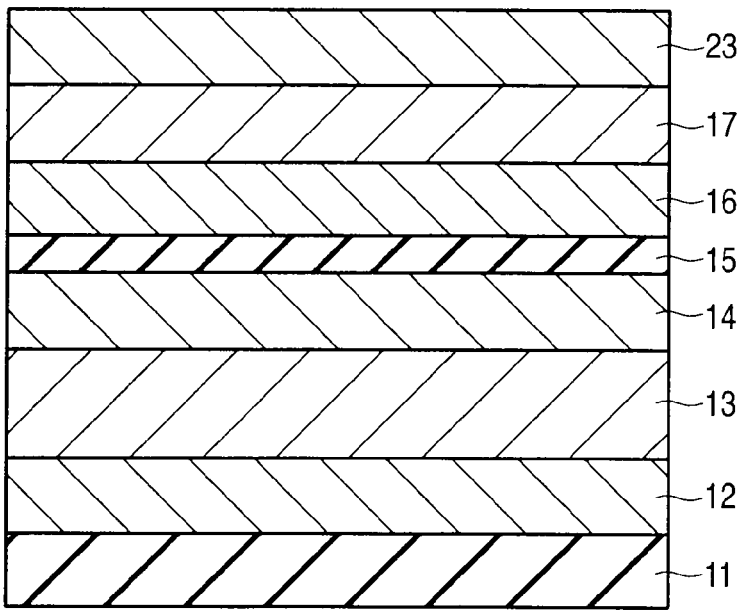
FIG. 4 is a sectional view showing a manufacturing step of the MTJ element 10 according to the first embodiment.

First, as shown in FIG. 4, an MTJ film is formed on the underlayer 11 made of, for example, silicon oxide having an amorphous structure by, for example, a sputtering process. This MTJ film is constituted of, in order of film formation, $PtO_2$ or a laminated film of $PtO_2$ and Ti having a film thickness of about 50 nm as the lower electrode layer 12; PtMn having a film thickness of about 50 nm as the antiferromagnetic layer 13; CoFeB or NiFe having a film thickness of about 2 to 5 nm as the fixed layer 14; MgO having a film thickness of about 1 nm as the tunnel barrier layer 15; CoFeB or NiFe having a film thickness of about 1 to 4 nm as the free layer 16; and $PtO_2$ or a laminated film of $PtO_2$ and Ti as the upper electrode layer 17.

Subsequently, a conductive hard mask layer 23 made of, for example, Ta is formed on the upper electrode layer 17 by use of, for example, the sputtering process. Subsequently, while applying a magnetic field of, for example, 2T to this MTJ film in a direction in which uniaxial anisotropy is to be imparted, the film is annealed in a vacuum at 360° C. for two hours to impart magnetic anisotropy to the free layer 16.

Here, usually in this annealing step (or a film forming step using the sputtering process), oxygen defect is generated in an MgO barrier, and the characteristics of the MgO barrier deteriorate. However, in the present embodiment, since a conductive metal oxide such as $PtO_2$ is used in the lower electrode layer 12 and the upper electrode layer 17, oxygen present in this conductive metal oxide migrates from the film to reach the MgO barrier, and the oxygen defect in the MgO barrier is compensated for. As a result, a defect due to the oxygen defect in the MgO barrier can be decreased to form the highly reliable tunnel barrier layer 15.

Figure 5:
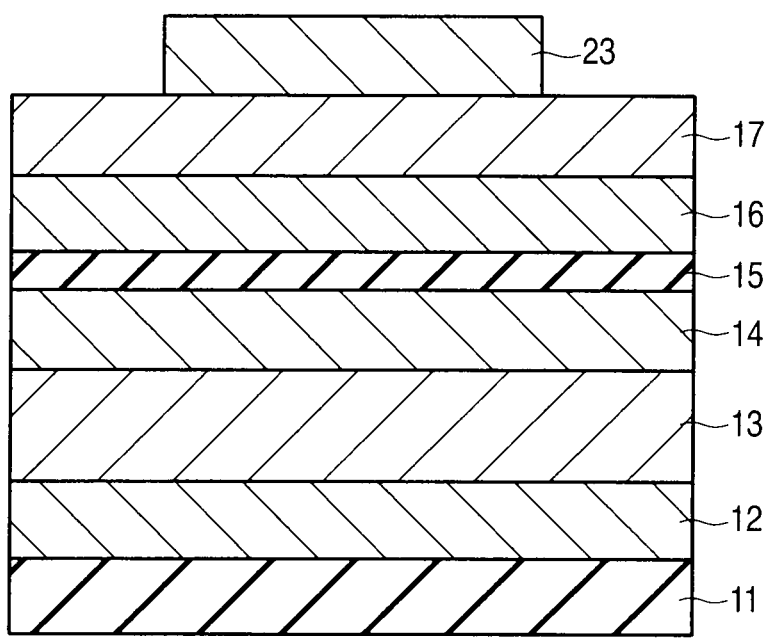
FIG. 5 is a sectional view showing a manufacturing step of the MTJ element 10 subsequently to FIG. 4.

Subsequently, as shown in FIG. 5, a resist (not shown) having the same planar shape as that of the MTJ element 10 is formed on the hard mask layer 23 by use of a photolithography process. Subsequently, the hard mask layer 23 is etched by use of the resist as a mask by, for example, a reactive ion etching (RIE) process. Then, a remaining resist and etching residuals are removed by an ashing process.

Figure 6:
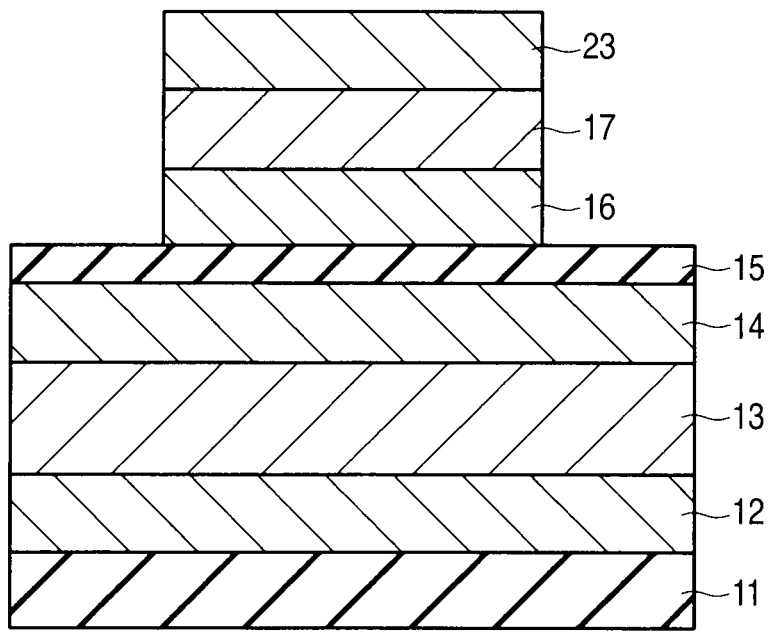
FIG. 6 is a sectional view showing a manufacturing step of the MTJ element 10 subsequently to FIG. 5.

Subsequently, as shown in FIG. 6, the upper electrode layer 17 and the free layer 16 are etched in this order by, for example, an ion milling process by use of the hard mask layer 23 as the mask and the tunnel barrier layer 15 as an etching stopper.

Subsequently, as shown in FIG. 7, a resist (not shown) having the same planar shape as that of the final lower electrode layer 12 is formed on the tunnel barrier layer 15 and the hard mask layer 23 by use of the photolithography process. Then, the tunnel barrier layer 15, the fixed layer 14, the antiferromagnetic layer 13 and the lower electrode layer 12 are etched in this order by the ion milling process or the RIE process by use of the resist as the mask and the underlayer 11 as the etching stopper.

Subsequently, as shown in FIG. 8, the protective film 18 made of, for example, silicon nitride is formed on the whole surface of the sample to cover the circumferential surface of the MTJ film. It is to be noted that this protective film 18 may be formed on the circumferential surface of the MTJ film, before forming the resist for use in etching the lower electrode layer 12.

Afterward, an interlayer insulating layer made of silicon oxide or the like is deposited on the whole surface of the sample, the upper surface of the sample is flattened by, for example, the chemical mechanical polishing (CMP) process, and the upper surface of the hard mask layer 23 is exposed. Finally, an interconnect layer made of, for example, Al or Cu is formed on the hard mask layer 23 and the interlayer insulating layer by, for example, the sputtering process, and this interconnect layer is patterned by the photolithography process and an etching process to form the bit line 19. The MTJ element 10 is formed in this manner.

As described above in detail, according to the present embodiment, since the conductive metal oxide is used in the lower electrode layer 12 and the upper electrode layer 17, the oxygen defect of the tunnel barrier layer 15 made of MgO or the like can be compensated for by oxygen present in this conductive metal oxide. In consequence, the defect due to the oxygen defect of the tunnel barrier layer 15 can be decreased, so that the reliability of the tunnel barrier layer 15 can be improved. Consequently, the tunnel barrier layer 15 can allow more spin-reversed current, so that the MTJ element having a high degree of freedom in design can be realized.

It is to be noted that one of the lower electrode layer 12 and the upper electrode layer 17 may be made of the conductive metal oxide, and the other layer may be made of a metal (e.g., tantalum (Ta), ruthenium (Ra), titanium (Ti) or a laminated film of them). Even in this constitution, the defect due to the oxygen defect of the tunnel barrier layer 15 can be decreased.

Second Embodiment

In a second embodiment, at least one of a fixed layer 14 and a free layer 16 has a laminated structure of a magnetic layer/a nonmagnetic layer/a magnetic layer, and a conductive metal oxide is used as the material of the nonmagnetic layer provided between two magnetic layers. In consequence, the oxygen defect of a tunnel barrier layer 15 can be compensated for to decrease the defect of the tunnel barrier layer 15 and to improve reliability.

Figure 9:
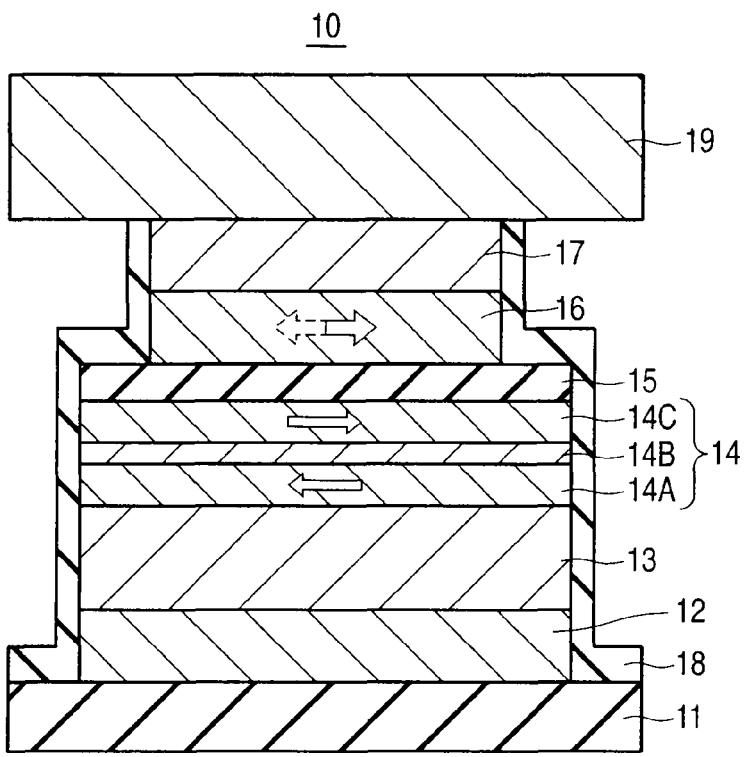
FIG. 9 is a sectional view showing a structure of an MTJ element 10 according to a second embodiment of the present invention.

FIG. 9 is a sectional view showing a structure of an MTJ element 10 according to the second embodiment of the present invention.

The MTJ element 10 has a laminated structure in which a lower electrode layer 12, an antiferromagnetic layer 13, the fixed layer 14, the tunnel barrier layer 15, the free layer 16 and an upper electrode layer 17 are laminated in order on an underlayer 11. Unlike the first embodiment, the lower electrode layer 12 and the upper electrode layer 17 are made of a metal. For example, tantalum (Ta), ruthenium (Ru), titanium (Ti) or a laminated film of them is used.

The fixed layer 14 has a synthetic anti-ferromagnet (SAF) structure. The SAF structure is a structure in which two magnetic layers are anti-ferromagnetically exchange-coupled. The fixed layer 14 is constituted of a magnetic layer 14A, a magnetic layer 14C and a nonmagnetic layer 14B sandwiched between these magnetic layers 14A and 14C, and has the SAF structure in which the magnetic layers 14A and 14C are anti-ferromagnetically exchange-coupled. That is, the magnetic layers 14A and 14C are magnetically coupled so that the magnetization directions of these layers have an anti-parallel state.

In this case, the magnetic layers 14A and 14C have anti-parallel magnetization arrangement, and this produces an effect that leaking magnetic fields from the magnetic layers 14A and 14C are offset and that the leaking magnetic field of the fixed layer 14 is eventually decreased. Moreover, the exchange-coupled magnetic layers improve thermal disturbance resistance as an effect of increasing a volume. The same material as that of the fixed layer 14 described in the first embodiment is used as the material of the magnetic layers 14A and 14C. It is to be noted that the fixed layer 14 may have a synthetic ferromagnetic (SF) structure in accordance with a material constitution and exchange coupling strength. That is, the magnetic layers 14A and 14C are magnetically coupled so that the magnetization directions of these layers have a parallel state.

Here, the conductive metal oxide is used as the material of the nonmagnetic layer 14B. The same material as that of the upper electrode layer and the lower electrode layer described in the first embodiment is used as the conductive metal oxide. The fixed layer 14 is formed into a laminated structure of, for example, CoFeB/RuO$_2$/CoFe. The free layer 16 is made of a single-layer magnetic material (CoFeB, NiFe, CoFe or the like).

In the MTJ element 10 having such a constitution, since the conductive metal oxide is used in the nonmagnetic layer 14B included in the fixed layer 14, the oxygen defect of the tunnel barrier layer 15 made of MgO or the like can be compensated for by oxygen present in this conductive metal oxide. In consequence, the defect due to the oxygen defect of the tunnel barrier layer 15 can be decreased, so that the reliability of the tunnel barrier layer 15 can be improved.

Moreover, the conductive metal oxide can be arranged closer to the tunnel barrier layer 15, so that the oxygen defect of the tunnel barrier layer 15 can further be decreased.

Figure 10A:
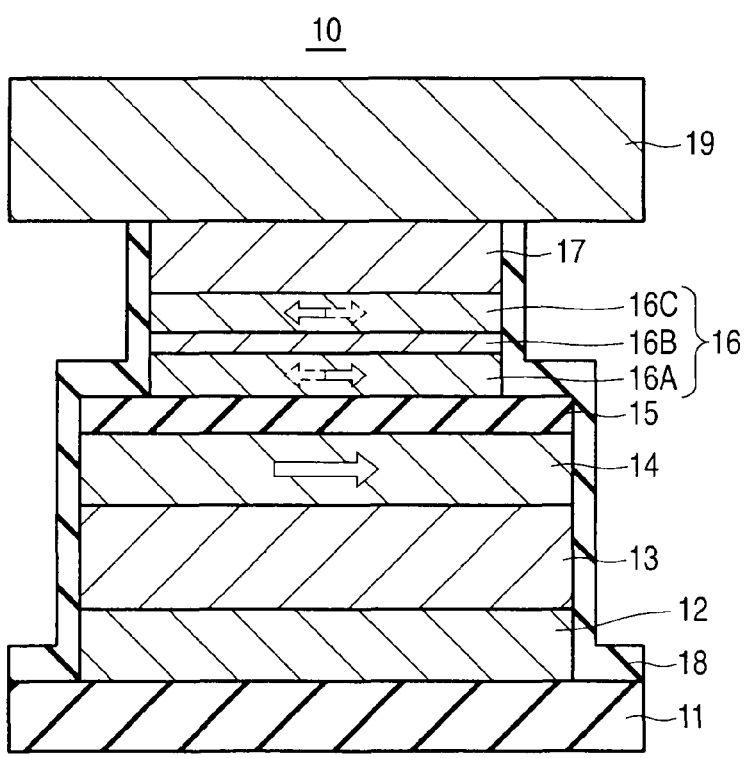
FIG. 10A is a sectional view showing another constitution example of the MTJ element 10 according to the second embodiment.

Furthermore, the free layer 16 may have the SAF structure. FIG. 10A is a sectional view showing another constitution example of the MTJ element 10 according to the second embodiment. As shown in FIG. 10A, the free layer 16 is constituted of a magnetic layer 16A, a magnetic layer 16C and a nonmagnetic layer 16B sandwiched between these magnetic layers 16A and 16C, and has an SAF structure in which the magnetic layers 16A and 16C are antiferromagnetically exchange-coupled.

In this case, the magnetic layers 16A and 16C have anti-parallel magnetization arrangement, and this produces an effect that leaking magnetic fields from the magnetic layers 16A and 16C are offset and that the leaking magnetic field of the free layer 16 is eventually decreased. Moreover, the exchange-coupled magnetic layers improve the thermal disturbance resistance as the effect of increasing the volume. The same material as that of the free layer 16 described in the first embodiment is used as the material of the magnetic layers 16A and 16C. It is to be noted that the free layer may have an SF structure in which the magnetic layers 16A and 16C are antiferromagnetically exchange-coupled.

Here, the conductive metal oxide is used as the material of the nonmagnetic layer 16B. The same material as that of the upper electrode layer and the lower electrode layer described in the first embodiment is used as the conductive metal oxide. The free layer 16 is formed into a laminated structure of, for example, CoFeB/RuO$_2$/CoFe. The fixed layer 14 is made of a single-layer magnetic material (CoFeB, NiFe, CoFe or the like). Even in this constitution, the oxygen defect of the tunnel barrier layer 15 made of MgO or the like can be compensated for.

Moreover, as another constitution example, both the fixed layer 14 and the free layer 16 may have the SAF structure. FIG. 10B is a sectional view showing another constitution example of the MTJ element 10 according to the second embodiment. The conductive metal oxide is used as the material of the nonmagnetic layers 14B, 16B. The same material as that of the upper electrode layer and the lower electrode layer described in the first embodiment is used as this conductive metal oxide. In this case, the number of the nonmagnetic layers as oxygen supply layers increases, so that the oxygen defect of the tunnel barrier layer 15 can further be decreased.

Furthermore, the present embodiment can be applied to the double-junction MTJ element shown in FIG. 2. In the case of the double-junction MTJ element, all of the fixed layers 14, 21 and the free layer 16 may have the SAF structure using the conductive metal oxide, or at least one of them may have the SAF structure using the conductive metal oxide. However, the fixed layer 14 or the free layer 16 disposed closer to the tunnel barrier layer 15 preferably has the SAF structure using the conductive metal oxide.

Third Embodiment

In a third embodiment, an insulating metal oxide is used as the material of a protective film 18 which covers the circumferential surface of an MTJ element 10. Then, the oxygen defect of a tunnel barrier layer 15 can be compensated for using oxygen included in this insulating metal oxide to decrease the defect of the tunnel barrier layer 15 and improve reliability.

[1] Structure of MTJ Element 10

FIG. 11 is a sectional view showing a constitution of the MTJ element 10 according to the third embodiment of the present invention. The materials of an antiferromagnetic layer 13, a fixed layer 14, the tunnel barrier layer 15 and a free layer 16 for use in the present embodiment are the same as those of the first embodiment. On the other hand, unlike the first embodiment, a lower electrode layer 12 and an upper electrode layer 17 are made of a metal. For example, tantalum (Ta), ruthenium (Ru), titanium (Ti) or a laminated film of them is used.

On the circumferential surface of the MTJ element 10, the protective film 18 is provided so that this MTJ element 10 is surrounded. As this protective film 18, the insulating metal oxide is used. As the insulating metal oxide, examples of a material which is a comparatively stable metal oxide and which has comparatively good affinity to a magnetic material include aluminum oxide (AlO$_x$), magnesium oxide (MgO), silicon oxide (SiO$_x$) and iron oxide (Fe$_x$O$_y$). The insulating metal oxide has a comparatively small atomic valence as compared with a noble metal.

[2] Manufacturing Method

Next, one example of a manufacturing method of a magnetoresistive element according to the present embodiment will be described with reference to the drawings.

First, as shown in FIG. 12, an MTJ film is formed on an underlayer 11 made of, for example, silicon oxide having an amorphous structure by, for example, a sputtering process. This MTJ film is constituted of, in order of film formation, Ta having a film thickness of about 50 nm as the lower electrode layer 12; PtMn having a film thickness of about 50 nm as the antiferromagnetic layer 13; CoFeB or NiFe having a film thickness of about 2 to 5 nm as the fixed layer 14; MgO having a film thickness of about 1 nm as the tunnel barrier layer 15; CoFeB or NiFe having a film thickness of about 1 to 4 nm as the free layer 16; and Ta as the hard mask layer 17. The hard mask layer 17 is used as the upper electrode layer.

Subsequently, while applying a magnetic field of, for example, 2T to this MTJ film in a direction in which uniaxial anisotropy is to be imparted, the film is annealed in a vacuum at 360° C. for two hours to impart magnetic anisotropy to the free layer 16. Subsequently, the MTJ film is patterned by a photolithography process and the RIE process in the same manner as in the first embodiment.

Subsequently, as shown in FIG. 13, the protective film 18 made of, for example, aluminum oxide (AlO$_x$) is formed on the whole surface of the sample to cover the circumferential surface of the MTJ film.

Subsequently, as shown in FIG. 11, an interlayer insulating layer (not shown) made of silicon oxide or the like is deposited on the whole surface of the sample, the upper surface of the sample is flattened by, for example, the chemical mechanical polishing (CMP) process, and the protective film 18 on the upper electrode layer 17 is removed to expose the upper surface of the upper electrode layer 17. Then, an interconnect layer made of, for example, Al or Cu is formed on a hard mask layer 23 and the interlayer insulating layer by, for example, the sputtering process, and this interconnect layer is patterned by the photolithography process and an etching process to form a bit line 19.

Subsequently, to activate the diffusing region of a selection transistor included in a front end of line (FEOL) section and connected to the MTJ element 10, the annealing is performed in a vacuum at 300° C. for two hours.

Here, usually in this annealing step (or a film forming step using the sputtering process), oxygen defect is generated in an MgO barrier, and the characteristics of the MgO barrier deteriorate. However, in the present embodiment, since an insulating metal oxide such as aluminum oxide (AlO$_x$) is used in the protective film 18, oxygen present in this insulating metal oxide migrates from the film to reach the MgO barrier, and the oxygen defect in the MgO barrier can be compensated for. The MTJ element 10 is formed in this manner.

As described above in detail, according to the present embodiment, the insulating metal oxide is used in the material of the protective film 18 which covers the circumferential surface of the MTJ element 10. Therefore, the defect of the tunnel barrier layer 15 due to the oxygen defect can be decreased, so that the reliability of the tunnel barrier layer 15 can be improved.

Moreover, since a part of the protective film 18 made of the insulating metal oxide comes in contact with the tunnel barrier layer 15, oxygen can efficiently be supplied from the protective film 18 to the tunnel barrier layer 15.

It is to be noted that the present embodiment can be applied to the double-junction MTJ element shown in FIG. 2. Moreover, the present embodiment can be applied to the MTJ element having the structure in which the free layer 16 and the fixed layer 14 are laminated as shown in FIG. 3. That is, in FIGS. 2 and 3, the protective film 18 is made of the insulating metal oxide. As the insulating metal oxide, the same material as the above material may be used. The lower electrode layer 12 and the upper electrode layer 17 may be made of the metal or the conductive metal oxide. In such a constitution, the defect of the tunnel barrier layers 15 and 20 due to the oxygen defect can be decreased.

Fourth Embodiment

In a fourth embodiment, a circumferential wall is formed on the circumferential surface of a protective film 18, and a metal oxide is used as the material of this circumferential wall. Then, the oxygen defect of a tunnel barrier layer 15 can be compensated for using oxygen included in this metal oxide to decrease the defect of the tunnel barrier layer 15 and improve reliability.

[1] Structure of MTJ Element 10

Figure 14A:
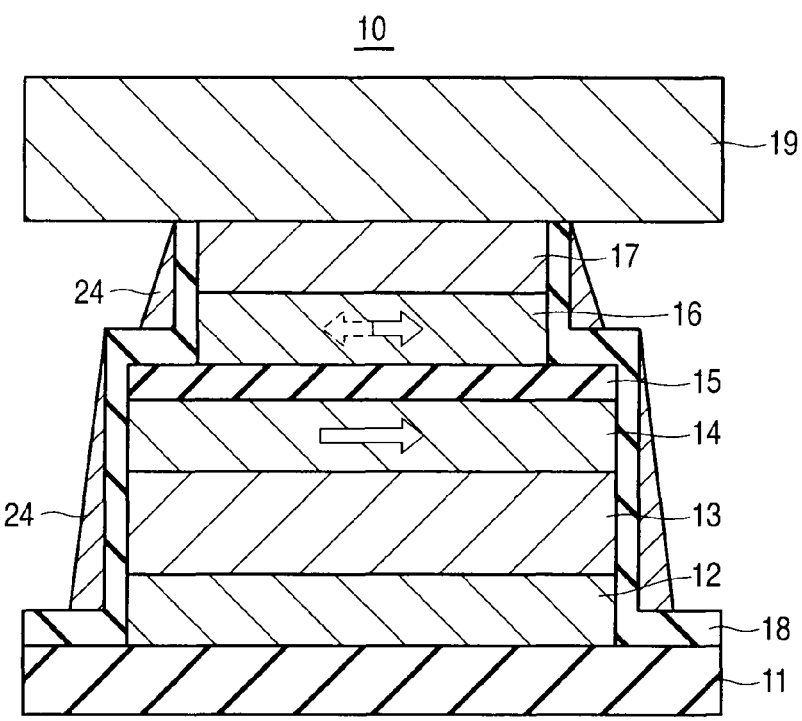
FIG. 14A is a sectional view showing a constitution of an MTJ element 10 according to a fourth embodiment of the present invention.

FIG. 14A is a sectional view showing a constitution of an MTJ element 10 according to the fourth embodiment of the present invention. The materials of an antiferromagnetic layer 13, a fixed layer 14, the tunnel barrier layer 15 and a free layer 16 for use in the present embodiment are the same as those of the first embodiment. On the other hand, unlike the first embodiment, a lower electrode layer 12 and an upper electrode layer 17 are made of a metal. For example, tantalum (Ta), ruthenium (Ru), titanium (Ti) or a laminated film of them is used.

On the circumferential surface of an MTJ film, the protective film 18 made of an insulator (e.g., silicon nitride) is provided so that this MTJ film is surrounded. Furthermore, a circumferential wall 24 is provided on the circumferential surface of the protective film 18 so that this protective film 18 is surrounded. As the circumferential wall 24, a metal oxide is used. As the metal oxide constituting the circumferential wall 24, a conductive metal oxide or an insulating metal oxide may be used. As the conductive metal oxide, the same material as that of the upper electrode layer and the lower electrode layer described in the first embodiment is used. As the insulating metal oxide, the same material as that of the protective film described in the third embodiment is used.

[2] Manufacturing Method

Next, one example of a manufacturing method of a magnetoresistive element according to the present embodiment will be described with reference to the drawings.

Figure 15:
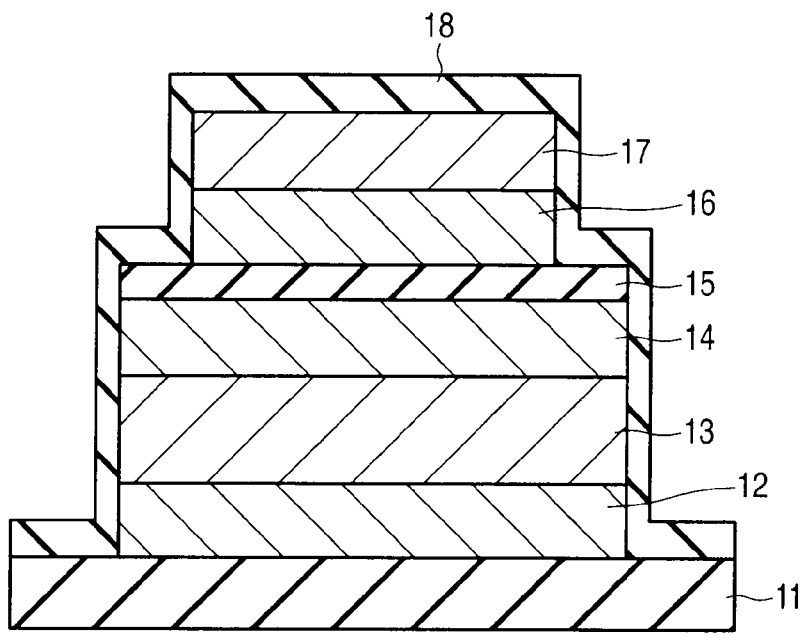
FIG. 15 is a sectional view showing a manufacturing step of the MTJ element 10 according to the fourth embodiment.

The same steps as those of the third embodiment are performed until an MTJ film is patterned. Subsequently, as shown in FIG. 15, the protective film 18 made of, for example, silicon nitride is formed on the whole surface of the sample to cover the circumferential surface of the MTJ film.

Figure 16:
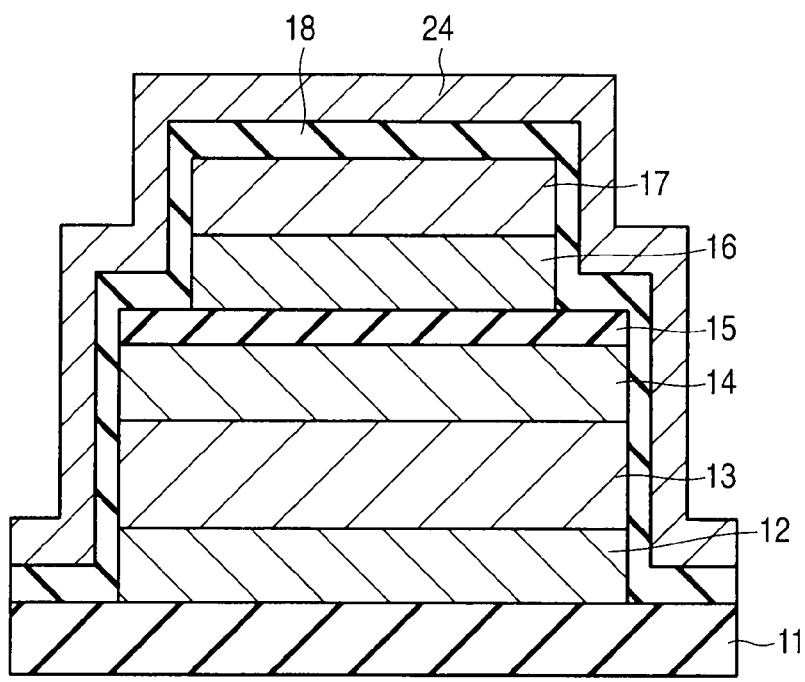
FIG. 16 is a sectional view showing a manufacturing step of the MTJ element 10 subsequently to FIG. 15.
Figure 17:
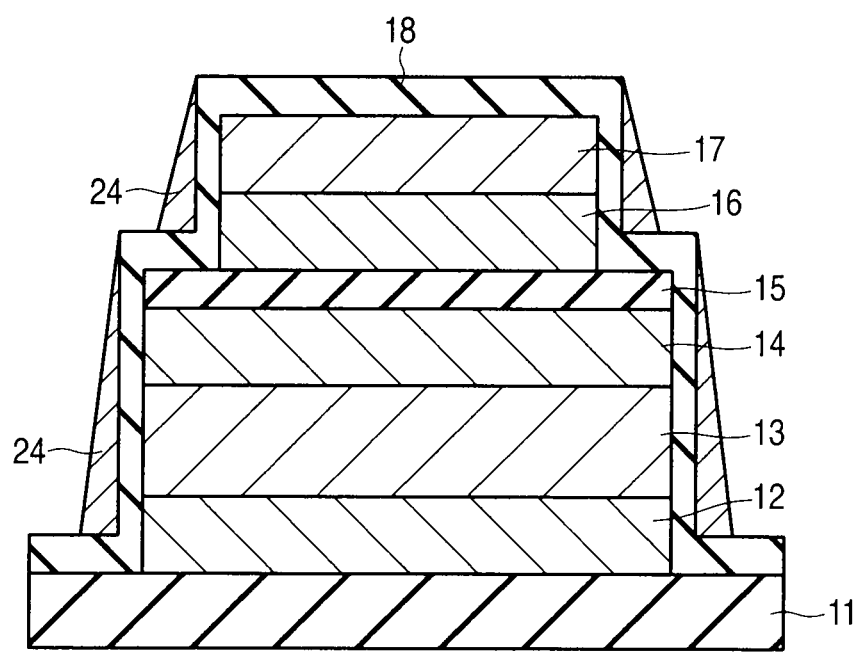
FIG. 17 is a sectional view showing a manufacturing step of the MTJ element 10 subsequently to FIG. 16.

Subsequently, as shown in FIG. 16, the metal oxide film 24 made of $PtO_2$ or a laminated film of $PtO_2$ and Ti is formed on the whole surface of the sample to cover the circumferential surface of the protective film 18. Subsequently, as shown in FIG. 17, the metal oxide film 24 is etched by the RIE process or an ion milling process so that the metal oxide film remains on the circumferential surface of the protective film 18, thereby forming the circumferential wall 24 made of the metal oxide on the circumferential surface of the protective film 18.

Subsequently, as shown in FIG. 14A, an interlayer insulating layer (not shown) made of silicon oxide is deposited on the whole surface of the sample, the upper surface of the sample is flattened by, for example, the chemical mechanical polishing (CMP) process, and the protective film 18 on the upper electrode layer 17 is removed to expose the upper surface of the upper electrode layer 17. Then, an interconnect layer made of, for example, Al or Cu is formed on a hard mask layer 23 and the interlayer insulating layer by, for example, a sputtering process, and this interconnect layer is patterned by a photolithography process and an etching process to form a bit line 19.

Subsequently, to activate the diffusing region of a selection transistor included in a front end of line (FEOL) section and connected to the MTJ element 10, annealing is performed in a vacuum at 300° C. for two hours.

Here, usually in this annealing step, oxygen defect is generated in an MgO barrier, and the characteristics of the MgO barrier deteriorate. However, in the present embodiment, since a metal oxide such as $PtO_2$ is used in the circumferential wall 24, oxygen present in this metal oxide migrates from the film to reach the MgO barrier, and the oxygen defect in the MgO barrier can be compensated for. The MTJ element 10 is formed in this manner.

As described above in detail, according to the present embodiment, since the metal oxide is used in the material of the circumferential wall 24 provided on the circumferential surface of the MTJ element 10, the defect of the tunnel barrier layer 15 due to the oxygen defect can be decreased, so that the reliability of the tunnel barrier layer 15 can be improved.

Figure 14B:
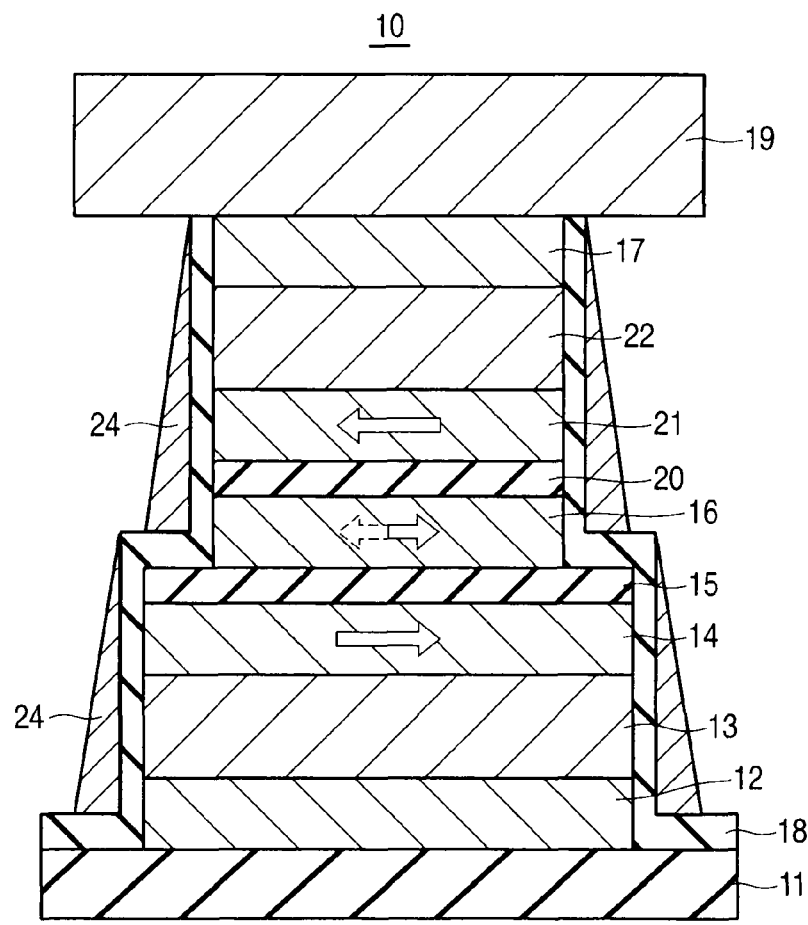
FIG. 14B is a sectional view showing another constitution example of the MTJ element 10 according to the fourth embodiment.

It is to be noted that the present embodiment can be applied to a double-junction MTJ element. FIG. 14B is a sectional view showing another constitution example of the MTJ element 10 according to the fourth embodiment. The MTJ element 10 is the double-junction MTJ element including two fixed layers 14 and 21. The circumferential wall 24 is provided on the circumferential surface of the protective film 18. As the circumferential wall 24, a metal oxide is used. Even in such a constitution, the defect of the tunnel barrier layers 15 and 20 due to the oxygen defect can be decreased.

Moreover, the present embodiment can be applied to the MTJ element having the laminated structure of the free layer 16 and the fixed layer 14 as shown in FIG. 3.

Fifth Embodiment

An MRAM can be constituted using an MTJ element 10 described in the first to fourth embodiments. An embodiment of a spin injection MRAM will hereinafter be described.

FIG. 18 is a sectional view showing a constitution of the MRAM according to a fifth embodiment of the present invention. A plurality of element separation insulating layers 32 are provided in the surface region of a P-type semiconductor substrate 31. The surface region of the semiconductor substrate 31 which is not provided with this element separation insulating layer is an element region (an active area) forming the element. The element separation insulating layers 32 are formed by, for example, shallow trench isolation (STI). As the STI 32, for example, silicon oxide is used.

In the active area of the semiconductor substrate 31, a selection transistor 33 is provided. The selection transistor 33 is made of, for example, an N-channel metal oxide semiconductor field effect transistor (MOSFET). That is, in the active area, a source region 33A and a drain region 33B are provided away from each other. Each of the source region 33A and the drain region 33B is an $N^+$-type diffusing region formed by introducing highly concentrated $N^+$-type impurities into the semiconductor substrate 31. A gate electrode 33D is provided on the semiconductor substrate 31 between the source region 33A and the drain region 33B via a gate insulating film 33C. The gate electrode 33D functions as a word line. The selection transistor 33 is constituted in this manner.

An interconnect layer 35 is provided in the source region 33A via a contact 34. The interconnect layer 35 functions as a source line.

On the drain region 33B, a contact 36, a first metal interconnect layer 37, a contact 38, a second metal interconnect layer 39, a contact 40 and a third metal interconnect layer 41 are laminated in order. On the third metal interconnect layer 41, an MTJ element 10 (specifically, a lower electrode layer 12 constituting the MTJ element 10) is provided via a contact 42. On the MTJ element 10 (specifically, an upper electrode layer 17 constituting the MTJ element 10), an interconnect layer 19 is provided. The interconnect layer 19 functions as a bit line. Moreover, a space between a semiconductor substrate 31 and an interconnect layer 19 is filled with an interlayer insulating layer (not shown) made of, for example, silicon oxide.

The bit line 19 and the source line 35 are connected to a power source circuit (a write circuit). This power source circuit bidirectionally supplies a current to the MTJ element 10. Owing to this current, binary data is written to the MTJ element 10.

As described above in detail, the MRAM can be constituted using the MTJ element 10 described in the first to fourth embodiments. It is to be noted that in the present embodiment, the spin injection MRAM has been described, but the MTJ element 10 described in the first to fourth embodiments can be applied to an MRAM of such a type that magnetization reverses owing to an external current magnetic field.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive element comprising:
    a first electrode layer;
    a first fixed layer provided on the first electrode layer and having a fixed magnetization direction;
    a first intermediate layer provided on the first fixed layer and made of magnesium oxide;
    a free layer provided on the first intermediate layer and having a variable magnetization direction; and
    a second electrode layer provided on the free layer,
    wherein the first electrode layer and the second electrode layer contain a conductive metal oxide, and
    oxygen is supplied to the first intermediate layer from the first and second electrode layers which are not in contact with the first intermediate layer.

2. The magnetoresistive element according to claim 1, wherein the conductive metal oxide is an NaCl-type metal oxide, a spinel-type metal oxide, a perovskite-$ReO_3$-type metal oxide, a corundum-type metal oxide or a rutile-$MoO_2$-type metal oxide.

3. The magnetoresistive element according to claim 1, further comprising:
    a second intermediate layer provided on the free layer and made of a nonmagnetic material; and
    a second fixed layer provided on the second intermediate layer and having a fixed magnetization direction.

4. The magnetoresistive element according to claim 3, wherein the second intermediate layer is made of copper (Cu), aluminum (Al), silver (Ag) or gold (Au).

5. The magnetoresistive element according to claim 1, wherein at least one of the fixed layer and the free layer is formed by laminating a first magnetic layer, a nonmagnetic layer and a second magnetic layer in this order.

6. The magnetoresistive element according to claim 1, the first fixed layer, the first intermediate layer and the free layer have the same crystalline orientation.

* * * * *